United States Patent
Kangguo et al.

(10) Patent No.: US 7,041,553 B2
(45) Date of Patent: May 9, 2006

(54) PROCESS FOR FORMING A BURIED PLATE

(75) Inventors: Cheng Kangguo, Beacon, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 10/709,869

(22) Filed: Jun. 2, 2004

(65) Prior Publication Data

US 2005/0272201 A1  Dec. 8, 2005

(51) Int. Cl.
*H01L 21/8242* (2006.01)

(52) U.S. Cl. ........................ 438/243; 438/386

(58) Field of Classification Search ............... 438/243, 438/386, 431, 433, 311, 638, 639, 643, 680, 438/700, 637, 712, 734, 770, 775, 914
See application file for complete search history.

(56) References Cited

U.S. PATENT DOCUMENTS

| | | | |
|---|---|---|---|
| 5,770,484 A * | 6/1998 | Kleinhenz | 438/155 |
| 5,871,811 A | 2/1999 | Wang et al. | |
| 5,945,704 A * | 8/1999 | Schrems et al. | 257/301 |
| 5,981,332 A * | 11/1999 | Mandelman et al. | 438/246 |
| 6,001,684 A | 12/1999 | Shen | |
| 6,057,216 A | 5/2000 | Economikos et al. | |
| 6,218,319 B1 | 4/2001 | Dutron et al. | |
| 6,316,310 B1 | 11/2001 | Wensley et al. | |
| 6,352,893 B1 * | 3/2002 | Michaelis et al. | 438/248 |
| 6,365,485 B1 | 4/2002 | Shiao et al. | |
| 6,426,254 B1 * | 7/2002 | Kudelka et al. | 438/246 |
| 6,544,856 B1 | 4/2003 | Morhard et al. | |
| 6,566,273 B1 * | 5/2003 | Kudelka | 438/733 |

* cited by examiner

*Primary Examiner*—David Nhu
(74) *Attorney, Agent, or Firm*—Daryl K. Neff; Steve Capella

(57) ABSTRACT

A method of making a buried plate region in a semiconductor substrate is provided. A trench is formed in a semiconductor substrate, the trench having a trench sidewall, the sidewall including an upper portion, and a lower portion disposed below the upper portion. A liner is formed along at least a portion of the trench sidewall, and thereafter, a dopant source layer is formed over the liner along the lower portion of the trench sidewall. The semiconductor substrate is then annealed to drive a dopant into the semiconductor substrate adjacent to the lower portion of the trench sidewall, while preventing the dopant from being driven into the semiconductor substrate adjacent to the upper portion of the trench sidewall.

20 Claims, 9 Drawing Sheets

PROCESS FOR FORMING A BURIED PLATE

BACKGROUND OF INVENTION

The invention relates to semiconductor processing, and more particularly to an improved method for forming a buried plate such as used in a trench capacitor of an advanced microelectronic device, e.g., a dynamic random access memory (DRAM).

A goal of the semiconductor industry is to increase the circuit density of integrated circuits ("ICs" or "chips"), most often by decreasing the size of individual devices and circuit elements of a chip. Trench capacitors are used in some types of DRAMs for storing data bits. Often, increasing the circuit density of such DRAMs requires reducing the size of the trench capacitor, which, in turn, requires reducing the area of the chip occupied by the trench capacitor. Achieving such reduction in surface area is not straightforward, because different components of the storage capacitor do not scale at the same rate, and some components cannot be scaled below a certain size. It would be desirable to provide a process of forming a trench capacitor which helps maintain the lateral dimensions of the trench capacitor within the tolerances at the surface of the chip required to achieve further reductions.

The fabrication of a trench capacitor begins by etching an opening in a semiconductor substrate. A trench capacitor is typically formed by a series of process steps, starting by etching a deep trench in a semiconductor region of a substrate. A patterned pad stack is generally provided on the substrate to define a window through which the opening is to be etched.

The trench capacitor is a plate capacitor, having as a first plate a "buried plate", which is a charge-containing region in the semiconductor substrate adjacent to the sidewall of the trench. A second plate of the capacitor is provided as a "node electrode", separated from the buried plate by a thin "node dielectric." The buried plate is typically disposed adjacent to only a lower portion of the trench, while an isolation collar is provided in the upper portion of the trench to isolate the trench capacitor from other nearby devices such as transistors. The buried plate is typically formed by outdiffusion of dopants from a dopant source into the lower portion. Typically, the dopant source is one that provides dopants, such as arsenic-doped silicate oxide, i.e., arsenic-doped glass (ASG). The dopant source is deposited to cover the sidewalls and bottom of the trench, such as through a low-pressure chemical vapor deposition (LPCVD) process. Thereafter, an annealing process is conducted to drive the dopants into the adjacent areas of the substrate to form the buried plate.

Unfortunately, conventional processing using ASG as a dopant source is not ideal. The ASG deposition tends to oxidize the semiconductor material at the sidewall of the deep trench. The ASG deposition also tends to cause dopant diffusion into the semiconductor material beyond the oxidized layer that forms at the semiconductor surface. These problems are illustrated with reference to FIG. 1.

FIG. 1 is a cross-sectional view illustrating a stage in the formation of a buried plate for a trench capacitor according to a prior art process. As shown in FIG. 1, a trench 105 is vertically etched into the semiconductor substrate 100 through an opening 115 in a pad stack 130. The sidewall 110 of the trench represents the edge of the semiconductor substrate, as stands after first etching the trench 105, before subsequent processes are performed. Illustratively, a layer 112 of ASG is deposited onto the sidewall 110 and bottom 145 of the trench 105 as a source of dopant material for later forming the buried plate. However, as a result of the deposition of the ASG, an oxide layer 150 forms due to the oxidation of the semiconductor substrate adjacent to the original trench sidewall 110. The oxide region 150 extends outwardly from the original trench sidewall 110 to a post-oxidation sidewall 140, thus widening the lateral dimension of the trench to the sidewall 140. The widening of the upper portion 180 of the trench is undesirable, because it negatively impacts the overlay tolerance. In addition, arsenic outdiffuses into the region 190 of the substrate adjacent to the oxidized region 150 during the ASG deposition process. Doping the upper trench portion 180 is undesirable because it increases the device leakage current and negatively impacts device performance.

FIG. 2 illustrates a subsequent stage in the conventional process of forming a buried plate, after a dopant drive-in anneal has been conducted. As shown, a buried plate 102 is disposed in the substrate surrounding a lower portion 170 of the sidewall of the trench 105. Illustratively, a layer 200 of an undoped oxide is disposed as a cap to protect the upper portion 180 of the trench sidewall from unwanted doping during the anneal process to drive dopants diffusing into the lower portion 170 of the trench. The cap layer 200 is formed after the undesired oxide 150 (FIG. 1) and the ASG layer have been removed from the upper portion 180 of the post-oxidation sidewall 140 of the widened trench.

FIG. 3 illustrates a further stage in fabrication, after a buried plate 102 has been formed. The trench with widened upper portion 180 is further illustrated in FIG. 3 as an increase in a lateral dimension 310, as measured by the spacing bounded by the post-oxidation trench sidewall 140. This increased dimension 310 is shown in relation to the original lateral dimension 305 of the trench, as represented by the original location 210 of the trench sidewall 110 (FIG. 1).

The two problems of trench widening and diffusion of arsenic into the substrate adjacent to the upper portion of the trench negatively impact the performance of the trench capacitor and the ability to maintain process tolerances. Both problems are due to the direct deposition of dopant source material (e.g., ASG) on the sidewall of the semiconductor substrate. Accordingly, a new method is desired to address the foregoing concerns.

SUMMARY OF INVENTION

A method is provided for forming a buried plate region in a substrate. A trench is formed in a semiconductor substrate, the trench having a trench sidewall, the sidewall including an upper portion, and a lower portion disposed below the upper portion. A liner is formed along the trench sidewall, and thereafter, a dopant source layer is formed over the liner in the lower portion of the trench. The liner prevents the upper portion of trench sidewall from being oxidized and doped. Buried plate is then formed by performing an anneal process to drive a dopant from the dopant source layer into the semiconductor substrate adjacent to the lower portion of the trench sidewall.

DETAILED DESCRIPTION

The embodiments of the invention described herein address the problems of the prior art, including the diffusion of a dopant into undesired areas and the undesired widening of the upper portion of the trench. In one embodiment, a liner is formed on an exposed surface of the semiconductor substrate at the trench sidewall prior to depositing a dopant source layer such as ASG. During the dopant source layer deposition, the liner functions as a diffusion barrier to prevent arsenic from diffusing into the semiconductor material at the upper portion of the trench. The liner also prevents the semiconductor substrate present at the trench sidewall from being oxidized during that deposition. During subsequent annealing, the liner loses its barrier function, allowing the dopant to outdiffuse into the semiconductor material adjacent the lower portion of the trench to form the buried plate. Further steps are performed to complete the trench capacitor.

Figure 2:
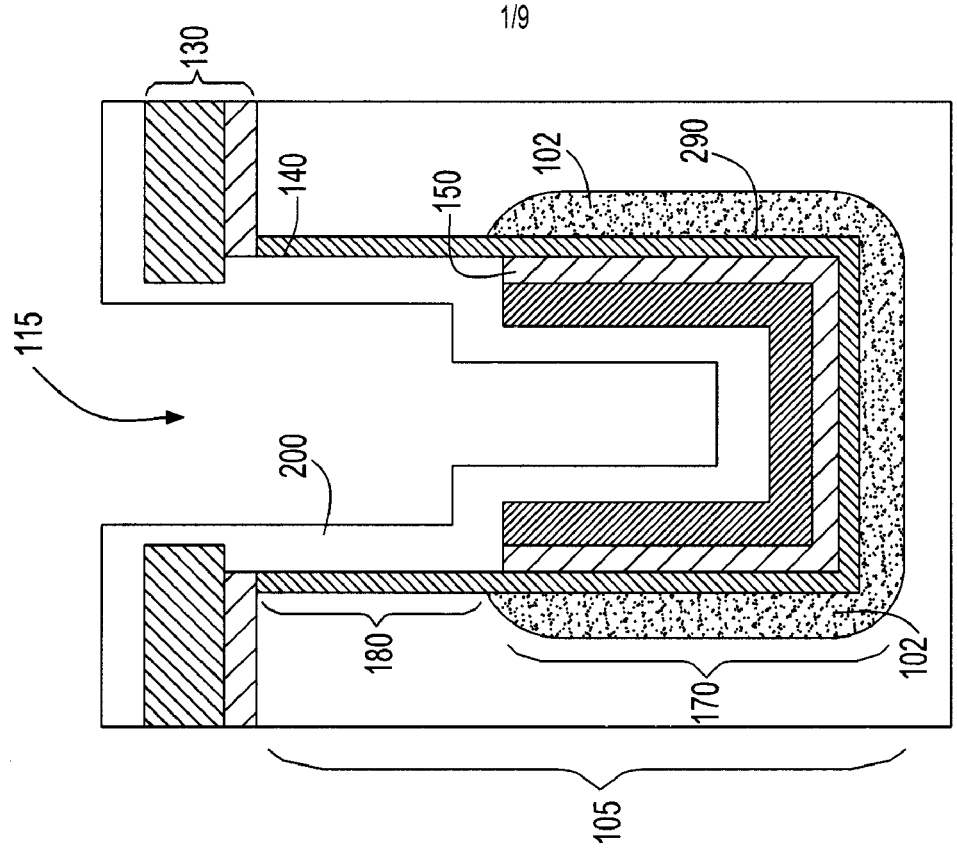
FIGS. 1 through 3 are a cross-sectional views illustrating stages in the fabrication of a trench capacitor according to a prior art method.
Figure 1:
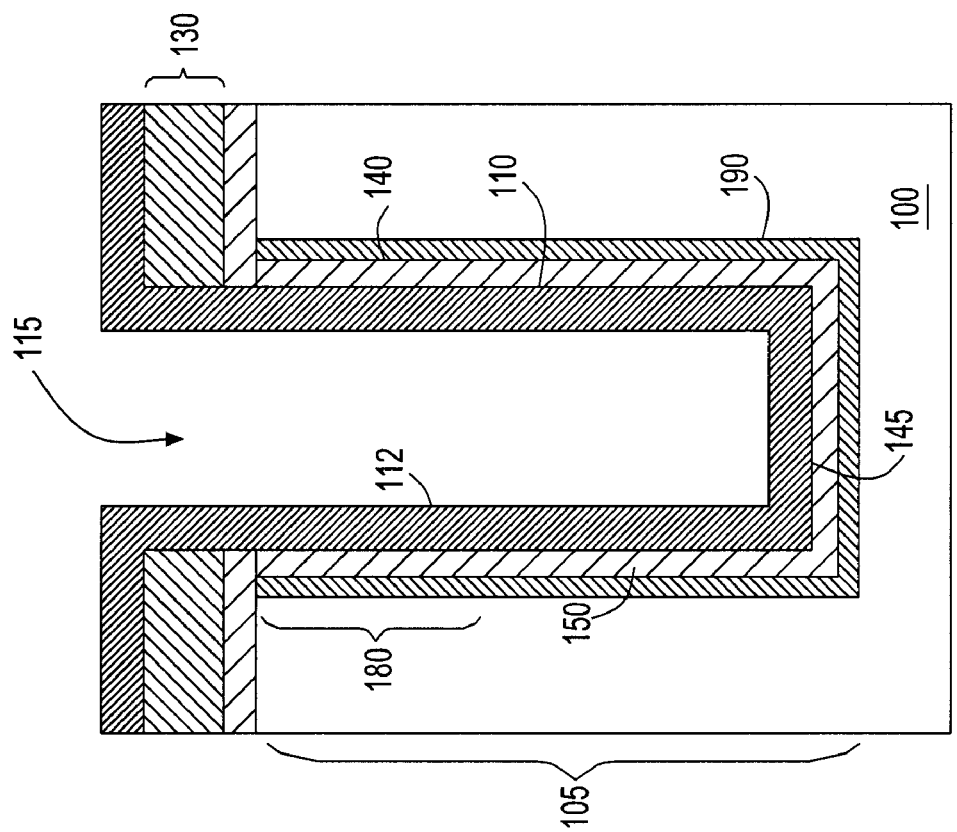
Figure 4:
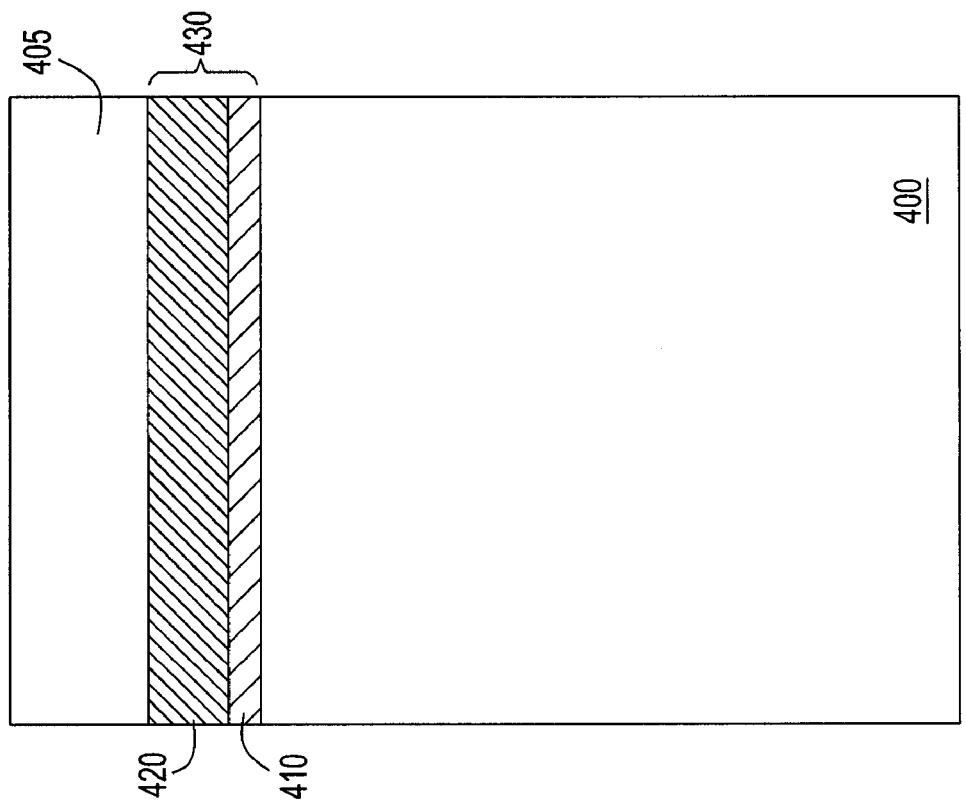
FIGS. 4 through 17 are cross-sectional views illustrating stages in the formation of a trench capacitor according to embodiments of the invention.
Figure 3:
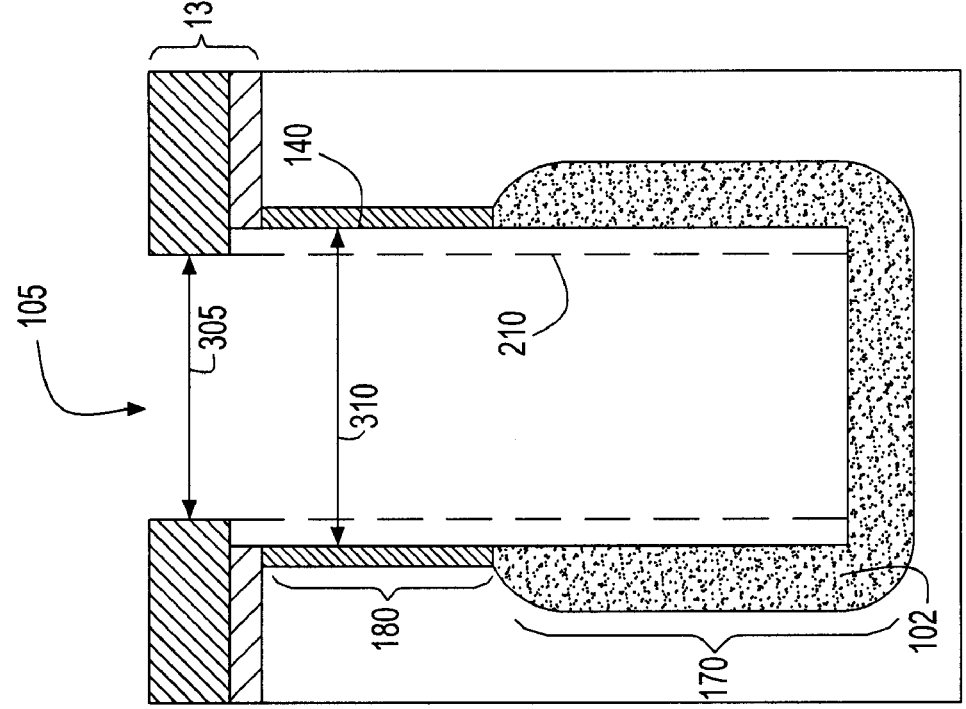
Figure 6:
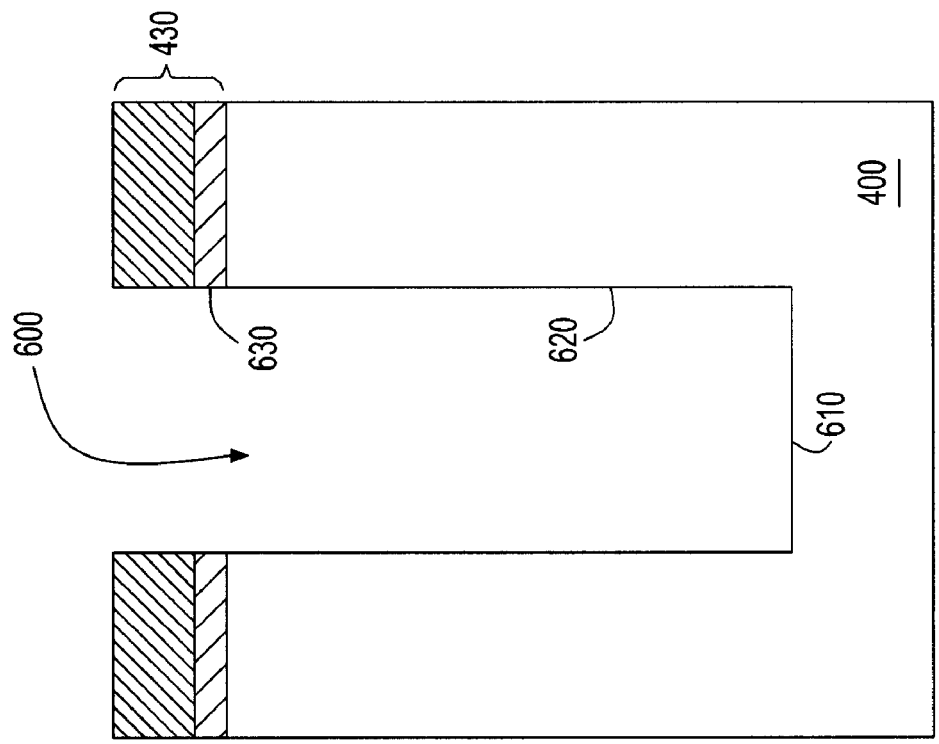
Figure 5:
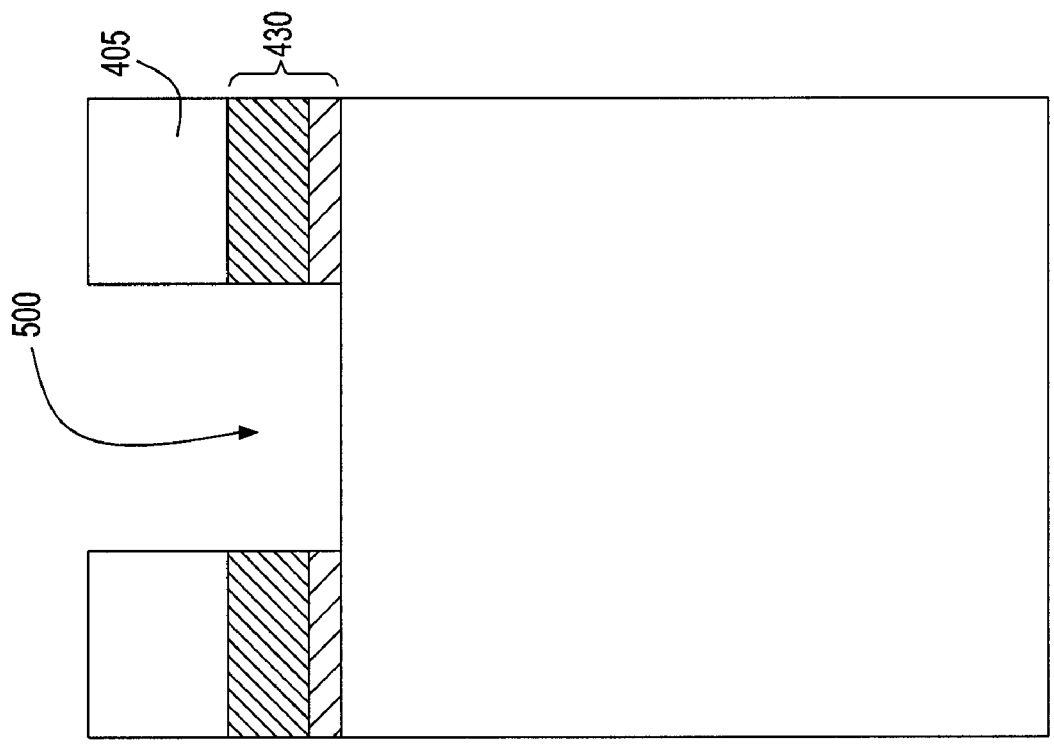

FIGS. 4 through 16 illustrate stages in processing according to an embodiment of the invention. FIGS. 4 through 6 illustrate a process of patterning a trench. Illustratively, in this process, the trench is patterned in a semiconductor substrate 400, which typically consists essentially of p-type doped silicon. Alternatively, the substrate has a semiconductor-on-insulator type structure, e.g., is a silicon-on-insulator (SOI) substrate. Other suitable alternative types of substrates include germanium, silicon germanium, silicon carbide, strained silicon, and those consisting essentially of one or more compound semiconductors having a composition defined by the formula $A_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates have a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

A variety of methods may be utilized to form the deep trench. Typically, a mask layer is first formed and patterned on the substrate, being comprised of a material less susceptible to etching, such as a hardmask layer of silicon oxide and/or silicon nitride or other material. FIG. 4 shows one embodiment in which an oxide layer 405 functions as a hardmask layer, disposed over a pad stack 430 having a nitride layer 420 and an optional oxide layer 410. The oxide layer 410 is formed between the pad nitride layer 420 and the semiconductor substrate 400 as a buffer layer to improve the adhesion of the pad nitride layer 420 and to reduce the interface stress.

As shown in the cross-sectional depiction of FIG. 5, the hardmask layer 405 is patterned and etched to create an opening 500 through which the trench will then be formed in the semiconductor substrate. Patterning can be done by forming a photoresist layer (not shown) and developed by any suitable process such as optical lithography, electron beam lithography, x-ray lithography, and ion beam lithography. The hardmask layer 405, along with the underlying pad stack 430 can then be etched selective to the photoresist using any conventional etch process, for example, reactive ion etch (RIE). The photoresist is stripped after forming opening the hardmask or after opening the hardmask and the underlying pad stack.

Referring to FIG. 6, the substrate 400 then is etched by any suitable process such as RIE to form deep trench 600. The remaining the hardmask layer is stripped after forming the deep trench. The deep trench has a small width, typically ranging from 90 nm to 150 nm according to the current generation of semiconductor devices. The deep trench is etched to a depth ranging between about 2 microns (μm) and 10 μm. Etching defines a trench 600 having a sidewall 620, and a bottom 610. In one embodiment as illustrated in FIG. 6, the trench 600 is patterned in a manner that aligns an edge 630 of the pad stack 430 to the sidewall 620 of the trench 600. Hereinafter, references generally to the trench sidewall and to the lower portion of the trench sidewall shall be understood to include the trench bottom 610 as well.

Figure 7:
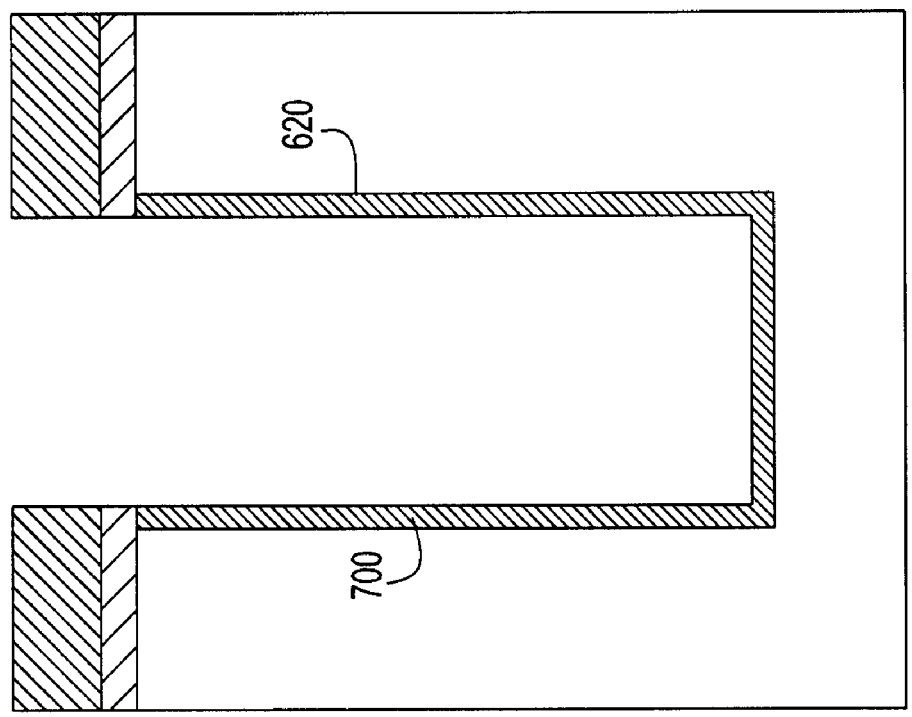

Referring to FIG. 7, a liner 700 is formed along the trench sidewall 620. The liner includes a material that functions as a diffusion barrier to prevent the outdiffusion of a dopant into the semiconductor substrate adjacent the trench during a subsequent deposition of a dopant source layer However, during a still later high temperature anneal, the liner loses its function as a diffusion barrier, allowing the dopant to outdiffuse from the dopant source layer through the liner into the silicon to form the buried plate. The liner will also protect the sidewall of the trench from being oxidized during the dopant source material deposition. Preferably, the liner comprises of a nitride formed thermally by a controlled nitridation of the semiconductor material present at the trench sidewall. Accordingly, a liner including silicon nitride is formed by the nitridation when the substrate is predominantly a silicon substrate. Preferably, the thickness of such thermal nitride is ranging from 5 angstroms (Å) to 20 Å and more preferably from 7 Å to 10 Å. Alternatively, a thermal oxide is suitable, such as formed thermally by a controlled oxidation of the semiconductor material present at the trench sidewall. When the substrate is predominantly a silicon substrate, the resulting liner includes silicon oxide. The preferred thickness of the thermal oxide ranges from 10 Å to 50 Å and more preferably from 15 Å to 25 Å. Other suitable liner materials include silicon carbide and metal silicides, etc., formed by thermal growth or deposition.

Figure 8:
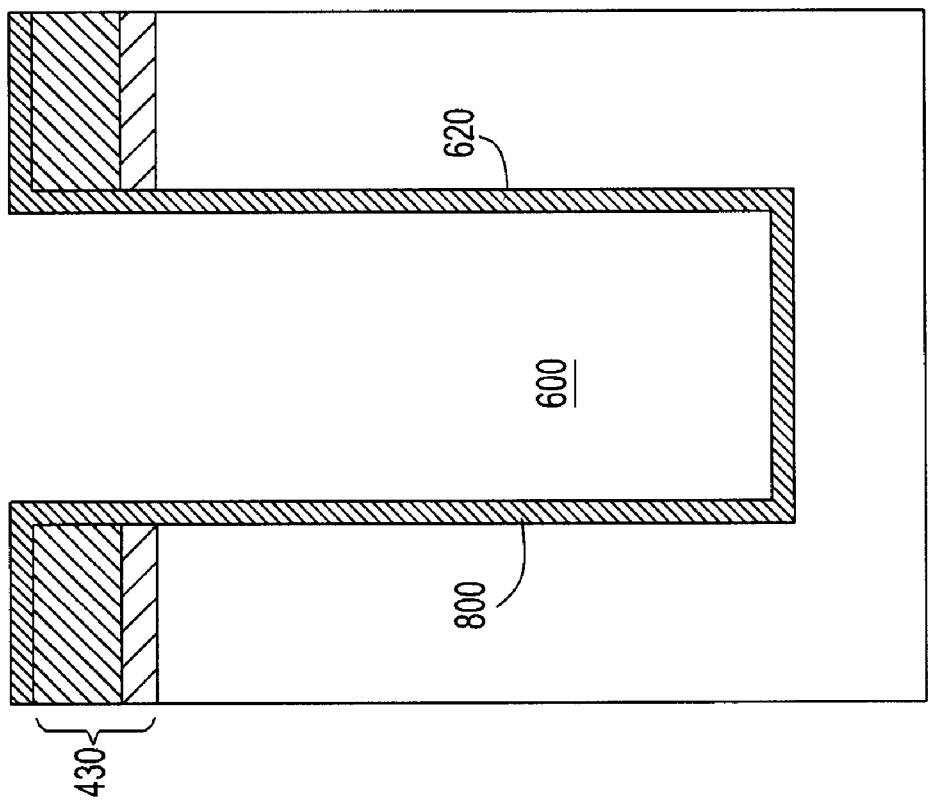

FIG. 8 illustrates a variation in which the liner 800 is deposited onto the sidewall 620 of the trench, rather than being formed by thermal nitridation or thermal oxidation. For example, the liner 800 can be formed by controlled LPCVD (low pressure chemical vapor deposition) or atomic layer deposition (ALD). In such case, the liner 800 extends over the pad stack 430. As a deposited liner, a layer of silicon nitride is suitable, having a thickness of between about 7 Å and 10 Å. Otherwise, a layer of silicon oxide having a thickness of about 20 Å can be deposited. Alternatively, any of the liner materials discussed above is suitable as liners. Hereinafter, all references to the liner 700 are to a liner as formed by local reaction of the semiconductor material, as described with reference to FIG. 7, with the understanding that a deposited liner 800 as described relative to FIG. 8 could be used in its place.

Figure 9:
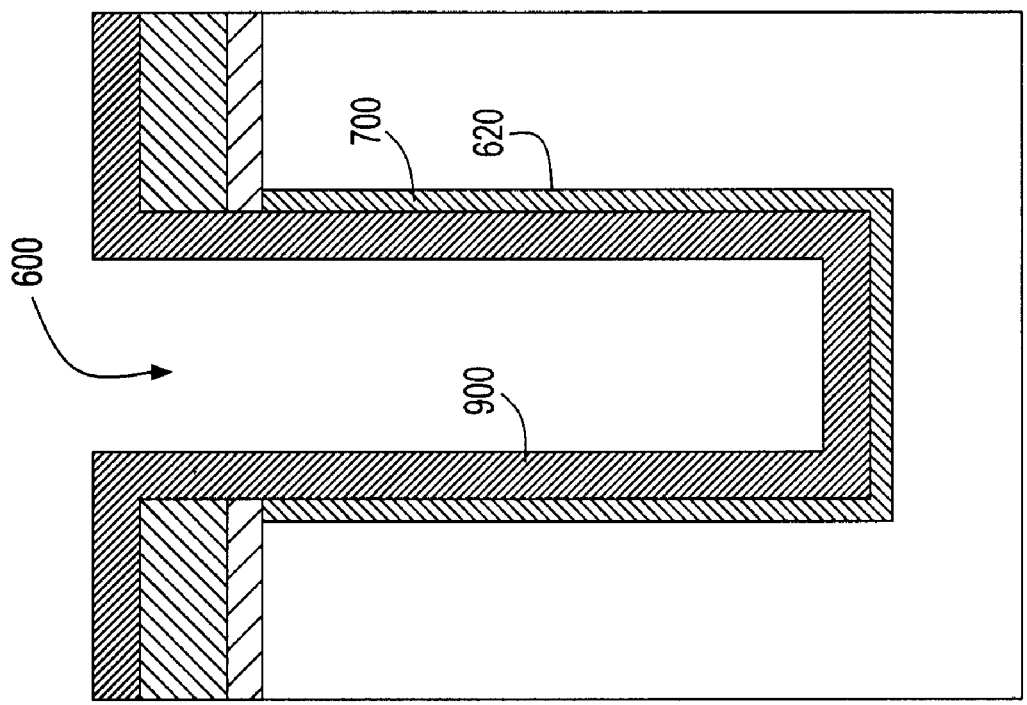

FIG. 9 illustrates a subsequent stage of processing in which a dopant source layer 900 is conformally deposited in the trench 600. The dopant source layer is typically ASG, having arsenic as an n-type dopant, although phosphosilicate glass (PSG) could be used instead, if processing conditions and results to be achieved permit. The dopant source layer 900 includes an n-type dopant for work function matching when used in trench capacitors connected in a typical arrangement to n-type FETs (NFETs) of an array of NFETs. Alternatively, a p-type dopant such as boron can be used when the capacitor requires a different work function, or for other purposes. In a typical dynamic random access memory (DRAM), trench capacitors connect to an array of NFETs. In such case, an n-type dopant source layer such as ASG is required to form the buried plate.

The deposition of the ASG layer 900 is illustratively performed by LPCVD, CVD (chemical vapor deposition), PECVD (plasma enhanced CVD), atomic layer deposition (ALD), or other suitable method. Preferably, low-pressure chemical vapor deposition (LPCVD) is used to deposit one or more relatively thin, high quality films. In a preferred embodiment, the ASG deposition is conducted by LPCVD at 700° C. for about 60 minutes, resulting in layer having a thickness of about 150 Å on the trench sidewall.

When the ASG layer 900 is deposited, the liner 700 acts as a diffusion barrier to suppress undesired outdiffusion of dopants into the semiconductor substrate. In addition, the liner 700 functions as a barrier during the ASG deposition to protect against undesired oxidation of the semiconductor substrate adjacent to the trench sidewall 620.

Figure 10:
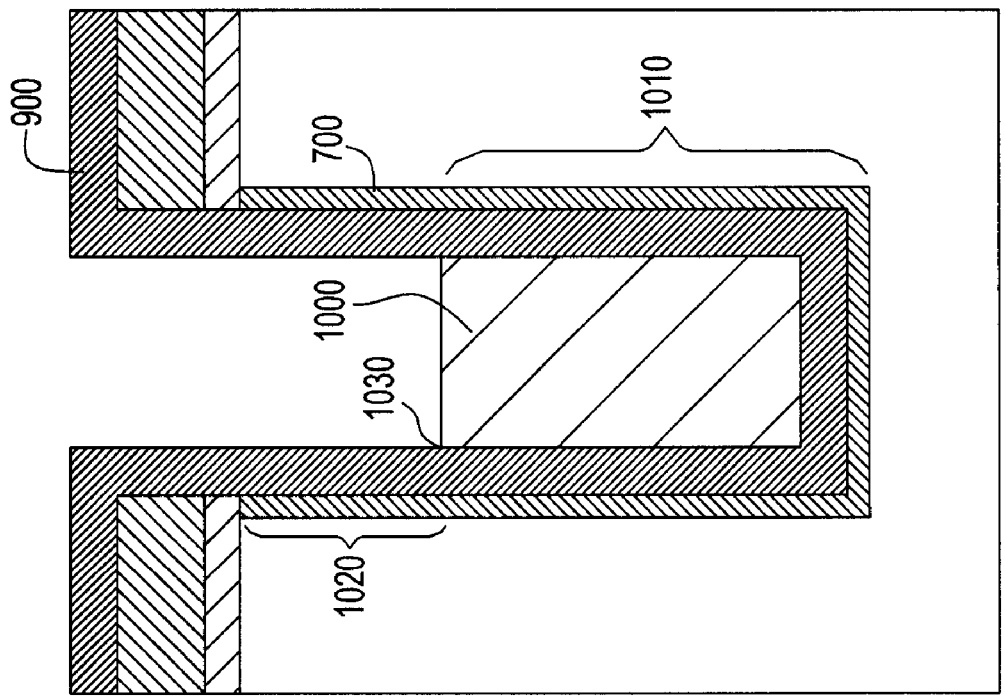

Referring to FIG. 10, after the deposition of the ASG layer 900, a filler material 1000, such as a photoresist, (hereinafter "resist") is deposited in the trench. Thereafter, the resist is recessed to a predetermined level, as by a timed etch, e.g. reactive ion etch (RIE), to define an upper portion 1020 and a lower portion 1010 of the trench sidewall, as illustrated in the cross-sectional view of FIG. 10. Alternatively, polysilicon can be deposited and recessed to fulfill this function. The level 1030 to which the resist is recessed defines a lower portion 1010 of the sidewall of the trench on which the capacitor will be formed later, and an upper portion 1020 of the trench sidewall to be reserved for another purpose.

Figure 12:
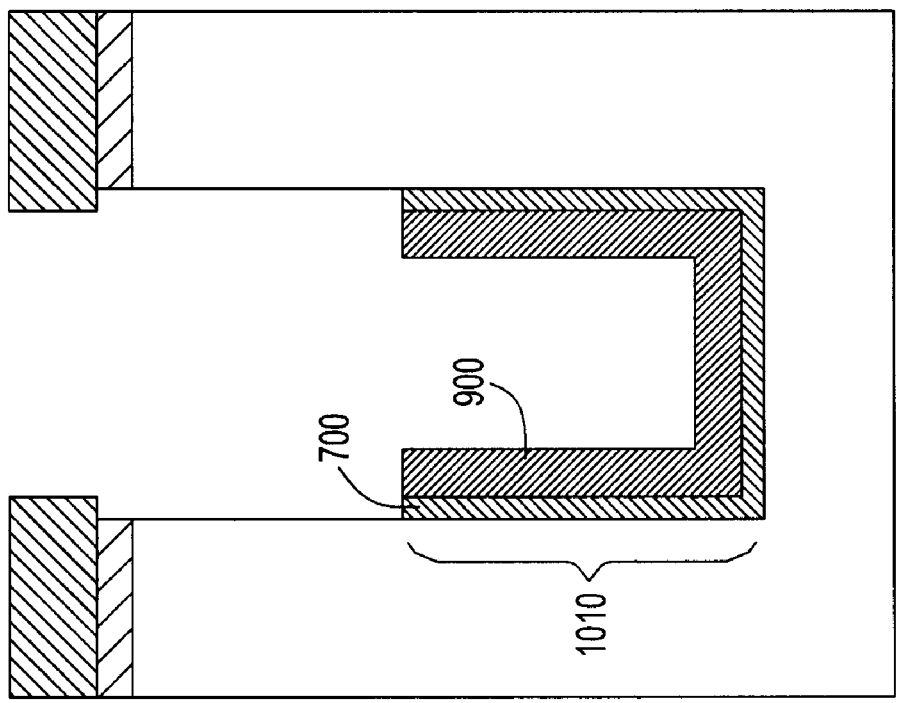
Figure 11:
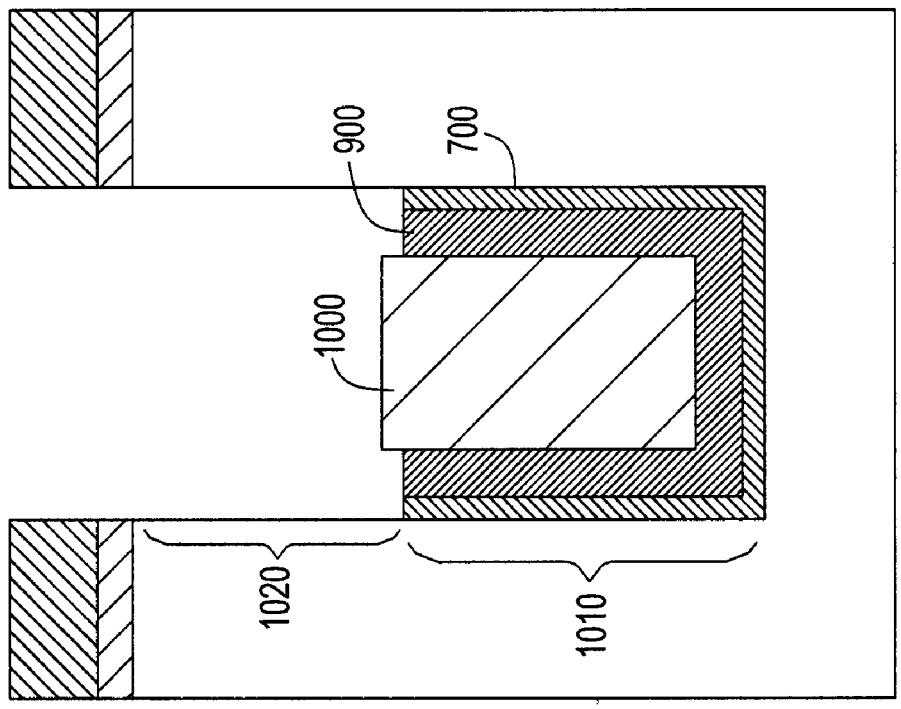

As shown in FIG. 11, the ASG layer 900 is removed from the upper portion 1020 of the trench sidewall, while the ASG layer 900 and liner 700 remain in place along the lower portion 1010, where covered by the resist 1000. The liner 700 may or may not be removed along with the ASG layer 900 from the upper portion 1020 at this stage. FIG. 11 shows a case in which the liner 700 is also removed from the upper portion 1020. Thereafter, FIG. 12 illustrates a subsequent stage in which the resist is removed from the trench, leaving the ASG layer 900 and liner 700 in place along the lower portion 1010 of the trench sidewall.

Figure 13:
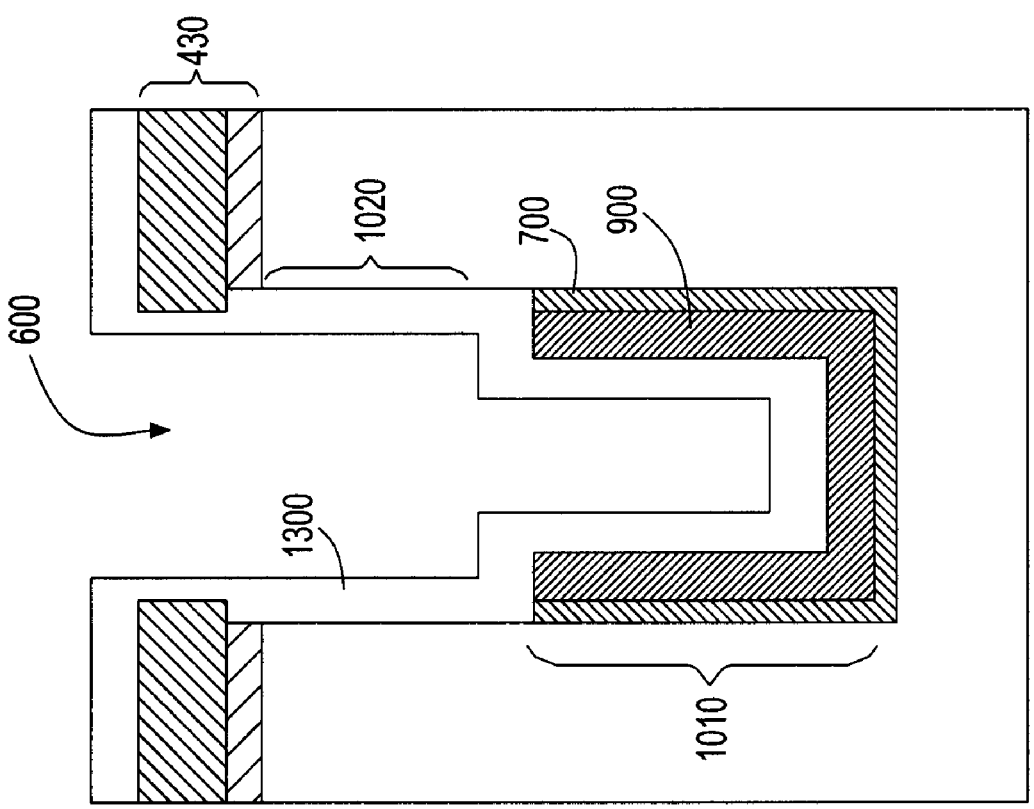

Thereafter, as shown in FIG. 13, a cap layer 1300 is deposited to cover the ASG layer 900 and liner 700 still present along the lower portion 1010 of the trench sidewall, as well as covering the exposed silicon along the upper portion 1020. As the cap layer 1300 is deposited conformally, it typically covers the pad stack 430, as well. The cap layer 1300 is preferably an undoped oxide, which can be deposited by any suitable process, preferably by LPCVD, or PECVD.

Figure 14:
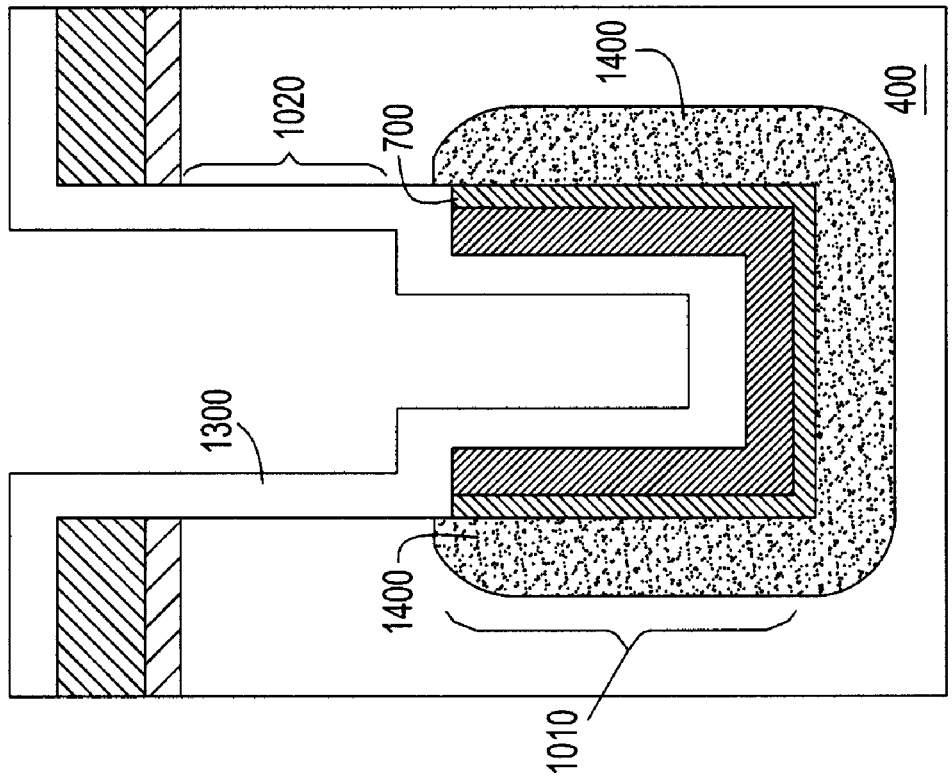

Next, referring to FIG. 14, a drive-in anneal is conducted to form the buried plate 1400. The anneal is performed at a temperature ranging from 900° C. to 1150° C., and preferably from 1000° C. to 1100° C., and more preferably at 1050° C. The annealing environment may contain oxygen, nitrogen, hydrogen, argon, helium, or any combination of these. During such anneal, the cap layer 1300 covers the substrate 400 adjacent to the upper portion 1020 and protect the upper portion of the substrate from outdiffusion of the dopant from the dopant source layer 900. Since the drive-in anneal is performed at a relative high temperature, the dopant can diffuse through the liner 700 into the substrate 400 adjacent to the lower portion to form a counter doped region as a buried plate 1400.

Figure 15:
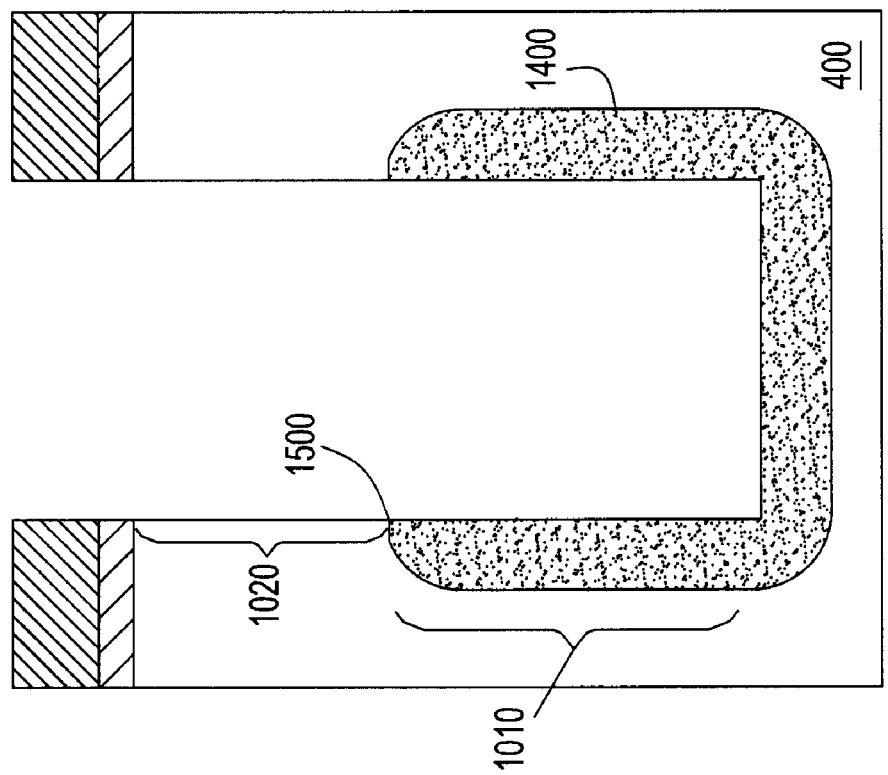

Thereafter, with reference to FIG. 15, the cap layer, ASG layer and liner are stripped, leaving the doped buried plate 1400 in the substrate adjacent to the lower portion 1010. At this point of processing, little, if any, widening of the trench has occurred in the upper portion 1020. With the liner, the upper portion has been spared from undesired oxidation and diffusion of dopants therein during the deposition of the ASG layer. Otherwise, excessive oxidation of the substrate 400 adjacent to the upper portion might have resulted in undesired widening of the trench after the removing the formed oxide.

Figure 16:
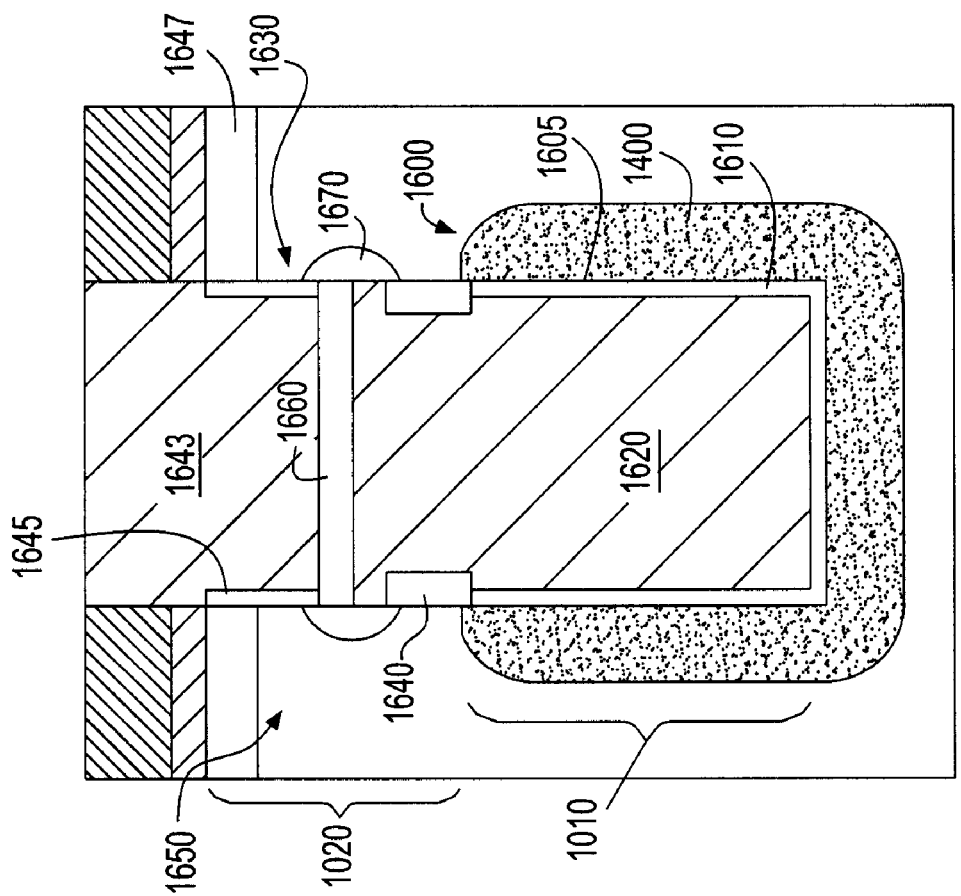

FIG. 16 illustrates a stage of processing after further steps have been performed to complete a trench capacitor 1600 therein and a vertical transistor 1650 disposed above the trench capacitor 1600. As shown in FIG. 16, the trench capacitor 1600 includes the buried plate 1400, a node dielectric 1610 formed on the sidewall 1605 of the silicon where the buried plate 1400 is located, and a node electrode 1620 disposed on the opposite side of the node dielectric 1610 from the buried plate 1400.

The formation of the vertical transistor 1650 along the upper portion 1020 of the trench sidewall is only illustrative. Many other structures and ways of forming transistors which connect to the trench capacitor are possible. In the example shown in FIG. 16, the trench capacitor 1600 is separated from the vertical transistor by an isolation collar 1640 formed on a part of the upper portion of the trench sidewall. The vertical transistor includes a gate conductor 1643, a gate dielectric 1645 and a channel region 1630. The channel region 1630 allows current to pass only when the gate conductor 1643 is biased at an appropriate voltage. The gate conductor 1643 is isolated from the node electrode 1620 by a trench top oxide 1660. The vertical transistor 1650 is electrically connected to the node electrode 1620 by an n-type buried strap outdiffusion 1670 formed in the silicon adjacent to the gate dielectric 1645, the trench top oxide 1660 and the node electrode 1620. A drain region 1647 is disposed above the channel region 1630.

Alternatively, instead of a vertical transistor, a planar transistor can be formed which connects to the trench capacitor 1600. Those skilled in the art will understand the known processes which can be used to form such planar transistor. Alternatively, the trench capacitor 1600 can be simply connected to circuitry of the chip, such as for use in providing a source of local capacitance, e.g., for decoupling purposes.

Figure 17:
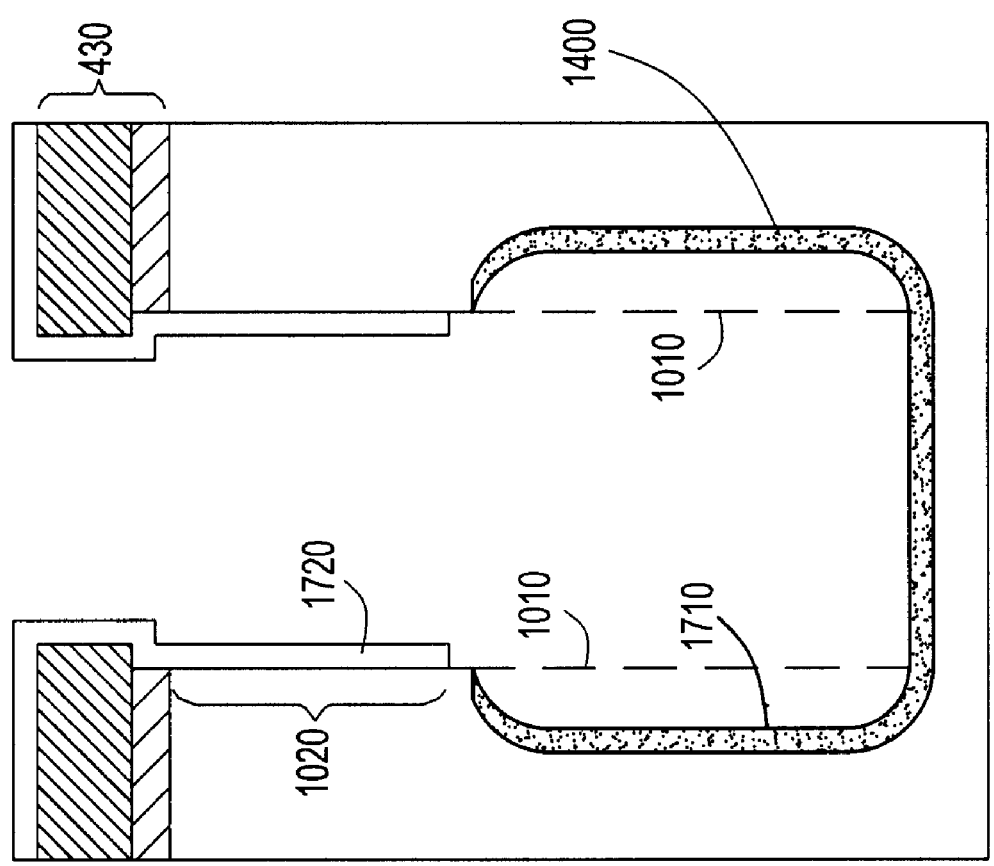

FIG. 17 illustrates a variation of the above-described embodiment, in which the trench is widened to a bottle shape, prior to completing the trench capacitor. In this case, a widened trench sidewall 1710 results. Widening the trench enlarges the cylindrical volume of the trench, which increases the outer surface area of the cylinder on which the trench capacitor will be formed, thus increasing capacitance. At the same time, the critical dimension of the trench in the region of the upper portion 1020 is maintained acceptably within tolerances for the overlaying of subsequent processes.

Preferably, the lower portion 1010 of the trench is widened by laterally etching the semiconductor material present at the sidewall 1500 (FIG. 15) of the trench by an etch process which is selective to more lightly doped semiconductor material. Such etch process proceeds more rapidly against the more highly doped semiconductor material present along the lower portion of the trench sidewall after the dopant drive-in. The result of etching is to produce a widened sidewall 1710 that is disposed to the outside of the former lower portion 1020 of the trench sidewall.

Alternatively, the lower portion is widened after forming a collar 1720 in the upper portion of the trench. In such case, the collar 1720 is formed by depositing a fill material (not shown) into the trench, recessing it to the level of the lower portion of the trench, and then depositing an oxide layer, or otherwise oxidizing the trench sidewall in the upper portion 1020. The oxide layer and fill material are then removed from the lower portion 1010 of the trench, as by RIE. Thereafter, the semiconductor material present at the lower portion of the trench sidewall is etched, as by a timed isotropic etch, to widen the lateral dimension of the trench to the bottle shape.

Accordingly, the foregoing described embodiments of the invention address challenges of the prior art through use of a liner to reduce diffusion of a dopant into the silicon along the upper portion of the trench sidewall and to reduce widening of the upper portion due to unwanted oxidation.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of making a buried plate region in a semiconductor substrate, comprising:
    forming a trench in a semiconductor substrate, the trench having a trench sidewall, the trench sidewall including an upper portion, and a lower portion disposed below the upper portion;
    forming a liner along at least the lower portion of the trench sidewall;
    thereafter forming a dopant source layer overlying the liner, the dopant source layer not being disposed along the upper portion of the trench sidewall; and
    annealing the semiconductor substrate to drive a dopant from the dopant source layer through the liner into the semiconductor substrate adjacent to the lower portion of the trench sidewall while preventing the dopant from being driven into the semiconductor substrate adjacent to the upper portion of the trench sidewall,
    wherein the liner functions as a diffusion barrier inhibiting diffusion of at least one of oxygen or the dopant into the semiconductor substrate during the step of forming the dopant source layer, and permits the dopant to diffuse through the liner into the semiconductor substrate during the step of annealing to form the buried plate.

2. A method as claimed in claim 1, wherein a cap layer is formed in the trench to prevent the dopant from being driven into the semiconductor substrate adjacent to the upper portion.

3. A method as claimed in claim 1, wherein the liner is formed by thermal nitridation.

4. A method as claimed in claim 3, wherein the liner has a thickness of between about 7 Å and 10 Å.

5. A method as claimed in claim 1, wherein the liner is formed by thermal oxidation.

6. A method as claimed in claim 3, wherein the liner has a thickness of about 20 Å.

7. A method as claimed in claim 1, wherein the cap layer consists essentially of an oxide.

8. A method as claimed in claim 1, wherein the cap layer consists essentially of an undoped oxide.

9. A method as claimed in claim 1, wherein the cap layer is a nitride layer.

10. A method as claimed in claim 1, wherein the annealing is conducted at a temperature of above about 900° C.

11. A method as claimed in claim 1, wherein the annealing is conducted at a temperature of about 1050° C.

12. A method as claimed in claim 1, further comprising removing the cap layer, the dopant source layer and the liner from the trench sidewall after the annealing, and thereafter etching material of the substrate exposed at the trench sidewall selectively to lightly doped semiconductor material, whereby the more heavily doped semiconductor material present at the lower portion of the trench sidewall is etched more rapidly than the more lightly doped semiconductor material present at the upper portion to widen the trench along the lower portion.

13. A method as claimed in claim 1, further comprising removing the cap layer, the dopant source layer and the liner from the trench sidewall after the annealing, thereafter forming a collar along the upper portion of the trench sidewall, and then widening the lower portion of the trench sidewall.

14. A method as claimed in claim 1, wherein the dopant source layer is formed by depositing arsenic doped glass (ASG) at a temperature of about 700° C.

15. A method of making a trench capacitor having a buried plate formed according to a method as claimed in claim 1, further comprising:
    forming a node dielectric along the lower portion of the trench sidewall after removing the liner and the dopant source layer; and
    depositing at least one of a conductive and a semiconducting material onto the node dielectric as a second plate opposing the buried plate.

16. The method of claim 1 wherein the liner and the dopant source layer are formed in the lower portion of the trench sidewall by forming the liner, forming the dopant source layer over the liner, depositing a cover material over the dopant source layer, recessing the cover material to a predetermined level, and removing the liner and the dopant source layer from the upper portion of the trench sidewall.

17. A method of forming a trench in a semiconductor substrate and a buried plate in the semiconductor substrate adjacent to a lower portion of the trench sidewall, comprising:
    forming a pad stack on a semiconductor substrate and patterning the pad stack to form an opening;
    patterning a trench having a trench sidewall through the opening by vertically etching the semiconductor substrate selective to a material of the pad stack;
    forming a liner substrate along the trench sidewall;
    forming a dopant source layer overlying the liner along lower portion of the trench sidewall;
    forming a cap layer covering at least an upper portion of the trench sidewall above the lower portion; and
    annealing to drive a dopant from the dopant source layer through the liner into the semiconductor substrate adjacent to the lower portion to form a buried plate,
    wherein the liner functions as a diffusion barrier inhibiting diffusion of at least one of oxygen or the dopant into the semiconductor substrate during the step of forming the dopant source layer, and permits the dopant to diffuse through the liner into the semiconductor substrate during the step of annealing to form the buried plate.

18. A method as claimed in claim 17, wherein the dopant source layer includes arsenic doped glass, the liner is formed by at least one of thermal oxidation and thermal nitridation, and the cap layer consists essentially of an undoped oxide.

19. A method of forming a trench capacitor in a semiconductor substrate, comprising:
    forming a pad stack on a semiconductor substrate and patterning the pad stack to form an opening;
    patterning a trench having a trench sidewall through the opening by vertically etching the substrate selective to a material of the pad stack;
    forming a liner on the semiconductor substrate along a sidewall of the trench sidewall;

forming a dopant source layer overlying the liner;

removing the dopant source layer from the liner along an upper portion of the trench sidewall, while allowing the dopant source layer to remain along a lower portion of the trench sidewall disposed below the upper portion;

forming a cap layer covering at least the upper portion of the trench sidewall;

annealing to drive a dopant from the dopant source layer through the liner into the semiconductor substrate adjacent to the lower portion to form a buried plate;

removing the cap layer, the dopant source layer and the liner from at least the lower portion of the trench sidewall;

forming a node dielectric along the lower portion of the trench sidewall; and forming a node electrode on a side of the node dielectric opposite the buried plate, wherein the liner functions as a diffusion barrier inhibiting diffusion of at least one of oxygen or the dopant into the semiconductor substrate during the step of forming the dopant source layer, and permits the dopant to diffuse through the liner into the semiconductor substrate during the step of annealing to form the buried plate.

20. A method as claimed in claim 19, wherein the liner is formed by at least one of thermal oxidation and thermal nitridation, the dopant source layer includes arsenic doped glass (ASG), and the cap layer consists essentially of an undoped oxide, the method further comprising widening the lower portion prior to forming the node dielectric and prior to forming the node electrode.

* * * * *